United States Patent
Koyata et al.

(10) Patent No.: US 7,601,642 B2
(45) Date of Patent: Oct. 13, 2009

(54) METHOD OF PROCESSING SILICON WAFER

(75) Inventors: Sakae Koyata, Tokyo (JP); Kazushige Takaishi, Tokyo (JP)

(73) Assignee: Sumco Corporation, Tokyo (JP)

( * ) Notice: Subject to any disclaimer, the term of this patent is extended or adjusted under 35 U.S.C. 154(b) by 250 days.

(21) Appl. No.: 10/558,789

(22) PCT Filed: May 27, 2004

(86) PCT No.: PCT/JP2004/007251

§ 371 (c)(1),
(2), (4) Date: Nov. 28, 2005

(87) PCT Pub. No.: WO2004/107424

PCT Pub. Date: Dec. 9, 2004

(65) Prior Publication Data
US 2006/0252272 A1 Nov. 9, 2006

(30) Foreign Application Priority Data
May 28, 2003 (JP) ............................. 2003-150261

(51) Int. Cl.
*H01L 21/461* (2006.01)
(52) U.S. Cl. ........................... 438/691; 216/88; 216/89; 257/E21.219; 257/E21.23; 257/E21.237; 438/460; 438/745; 438/747; 438/750; 438/753
(58) Field of Classification Search ................. 438/460, 438/691, 745, 750, 753; 257/E21.219, E21.23, 257/E21.237; 216/88.89
See application file for complete search history.

(56) References Cited

U.S. PATENT DOCUMENTS

| 7,332,437 B2 * | 2/2008 | Nihonmatsu et al. ........ 438/691 |
| 2004/0108297 A1 * | 6/2004 | Erk et al. ....................... 216/2 |

FOREIGN PATENT DOCUMENTS

JP 55-058535 5/1980

(Continued)

OTHER PUBLICATIONS

Fumio Shimura, Fig. 3.1, Handotai Silicon Kessho Kogaku (Semiconductor Silicon Crystal Engineering), published by Maruzen Co., Ltd., Sep. 30, 1993, p. 104, accompanied by an English language translation.

(Continued)

*Primary Examiner*—Asok K Sarkar
(74) *Attorney, Agent, or Firm*—Greenblum & Bernstein, P.L.C.

(57) ABSTRACT

The inventive method for processing a silicon wafer is a method comprising step 11 in which a single crystal ingot is sliced into thin disc-like wafers; step 13 in which the surface of each wafer is lapped to be planar; step 14 in which the wafer is subjected to alkaline cleaning to be removed of contaminants resulting from preceding machining; and step 16 in which the wafer is alternately transferred between two groups of etching tanks one of which contain acidic etching solutions and the other alkaline etching solutions, wherein an additional step 12 is introduced between step 11 and step 13 in which a wafer is immersed in an acidic solution containing hydrofluoric acid (HF) and nitric acid ($HNO_3$) at a volume ratio of ⅛ to ½ ($HF/HNO_3$) so that degraded superficial layers occurring on the front and rear surfaces of the wafer as a result of machining can be removed and the edge surface of the wafer can be beveled.

The inventive method simplifies the steps involved in the processing of a wafer, and reduces the intervention of alkaline cleaning accompanied with mechanical beveling, thereby reducing the risk of contamination due to metal impurities which may result from alkaline cleaning.

3 Claims, 2 Drawing Sheets

FOREIGN PATENT DOCUMENTS

| | | | |
|---|---|---|---|
| JP | 05-243208 | * | 9/1993 |
| JP | 08-306652 | | 11/1996 |
| JP | 09-298172 | | 11/1997 |
| JP | 10-112450 | | 4/1998 |
| JP | 2003-7672 | | 1/2003 |
| TW | 344855 | | 7/1986 |

OTHER PUBLICATIONS

English language Abstract of JP 10-112450.
English Abstract of the appeal decision; Re Korean Patent Application No. 10-2005-7022436.

* cited by examiner

METHOD OF PROCESSING SILICON WAFER

CROSS-REFERENCES TO RELATED APPLICATIONS

This application claims International Application PCT/JP2004/007251 filed May 27, 2004 and priority of Japanese Application No. 2003-150261 filed May 28, 2003, the entire disclosure of which is hereby incorporated by reference.

TECHNICAL FIELD

The present invention relates to a method for processing a silicon wafer which can prevent contamination due to metal impurities which would otherwise occur as a result of the cleaning of the wafer performed subsequent to its having undergone various machining processes.

BACKGROUND ART

Following steps have been disclosed as a conventional method for the processing of a silicon wafer (see, for example, Nonpatent literature 1).

A single silicon crystal rod pulled up from a crucible is cut at its frond and rear ends, and then divided into a number of blocks. The block has its periphery abraded until it has a diameter close to a desired one. Then, an orientation flat or a notch is formed to mark a specified orientation of the crystal. The single crystal ingot thus formed is first sliced at a specified angle to the longitudinal axis of the ingot with the blade of a cutter into thin, disc-like slices, thereby producing a plurality of silicon wafers as shown in FIG. 2(a) (step 1). FIG. 2(b) shows the cross-sections of silicon wafers having undergone the corresponding steps of FIG. 2(a).

The silicon wafer thus obtained is subjected to cleaning using, for example, an alkaline detergent in order to remove oils adhered possibly as a result of processing such as peripheral abrasion, slicing step 1, etc. (step 2)

Then, wafers are automatically transported to and from, for example, by a robot while they are subjected to machining processes and are processed into devices. The peripheral edge of a wafer is beveled because a wafer whose peripheral edge is not beveled and thus is rectangular will tend to develop notches and flaws, and silicon particles as a result of mechanical impacts to the wafer encountered by accident during transportation might degrade the surface of adjacent wafers. To prevent the development of such notches and flaws, the peripheral edge of a silicon wafer is beveled with a diamond grinder (step 3). The beveling performed during step 3 is also effective for preventing the occurrence of an abnormal development (crown phenomenon) of a film along the periphery of a wafer during the epitaxial growth of a film in a subsequent step or during the application of a photo resist. A wafer having undergone step 3 or beveling step is subjected to alkaline cleaning (step 4). During step 4, contaminants that might occur as a result of beveling during step 3 are removed.

Then, degraded superficial layers developed on the surfaces of a wafer which would occur as a result of slicing performed during step 1 are removed by lapping so that the smoothness of the surfaces of the wafer and their parallelism can be improved (step 5). After the lapping step 5, the wafer is subjected to alkaline cleaning (step 6). During step 6, contaminants that might occur as a result of lapping during step 5 are removed.

Then, the wafer having undergone the lapping step 5 is subjected to fine beveling (step 7). The wafer having undergone the fine beveling step 7 is subjected to alkaline cleaning (step 8). During step 8, contaminants that might occur as a result of fine beveling during step 7 are removed.

Subsequently, the wafer is etched by being immersed in an acidic etching solution (step 9). During step 9, any degraded superficial layers that might occur on the front and rear surfaces of the wafer as a result of the above machining are completely eliminated.

Wafers processed as described above will undergo additional processing (not illustrated) such as abrasion, heating, mirror polishing, cleaning, etc. to receive further processing necessary for the fabrication of devices.

Nonpatent literature 1: Shimura, F., "Engineering of Semiconductor Silicon Crystals," Maruzen, Sep. 30, 1993, p. 104.

DISCLOSURE OF INVENTION PROBLEMS TO BE SOLVED BY THE INVENTION

With a conventional process as described in the nonpatent literature 1, each time a wafer has been subjected to machining such as beveling or fine beveling like step 3 or 7 described above, an alkaline cleaning step must be introduced without fail to remove contaminants occurring as a result of the machining. This possesses another problem that the detergent used for alkaline cleaning itself contaminated with impurities, particularly metal impurities.

An object of the present invention is to provide a method for processing a silicon wafer enabling the simplified processing thereof.

Another object of the present invention is to provide a method for processing a silicon wafer which can reduce the risk of a wafer being contaminated by metal impurities subsequent to alkaline cleaning by minimizing the intervention of alkaline cleaning which would be otherwise introduced each time subsequent to beveling.

Means for Solving the Problems

An aspect of the invention represented by claim 1 relates to an improved method for processing a silicon wafer. As shown in FIG. 1(a), the method comprises a slicing step 11 in which a single crystal ingot is sliced into thin disc-like wafers, a lapping step 13 in which the surface of each wafer is lapped to be planar, an alkaline cleaning step 14 in which the wafer is subjected to alkaline cleaning to be removed of contaminants resulting from preceding machining, and an etching step 16 in which the wafer is alternately transferred between two groups of etching tanks one of which contain acidic etching solutions and the other alkaline etching solutions.

The method is characterized by its including a beveling step 12 between the slicing step 11 and the lapping step 13 in which a wafer is immersed in an acidic solution containing hydrofluoric acid (HF) and nitric acid ($HNO_3$) at a volume ratio of ⅛ to ½ (HF/$HNO_3$) so that degraded superficial layers occurring on the front and rear surfaces of the wafer as a result of machining can be removed and its edge surface can be beveled.

According to the aspect of the invention represented by claim 1, instead of mechanical beveling employed by the conventional method, step 12 is introduced in which a wafer is immersed in an acidic solution containing hydrofluoric acid (HF) and nitric acid ($HNO_3$) at a volume ratio of ⅛ to ½ (HF/$HNO_3$) which enables simultaneously the removal of degraded superficial layers resulting from preceding machining as well as beveling of the edge of the wafer. Thus, the method simplifies processing of the wafer. The method further dispenses with the necessity of alkaline cleaning which must be introduced subsequent to mechanical machining, which will reduce the risk of the wafer being contaminated with metal impurities, particularly Cu-based impurities associated with alkaline cleaning.

Another aspect of the present invention represented by claim 2 relates to a modification of the method of claim 1 in which etching using an acidic solution containing hydrofluoric acid and nitric acid is adjusted such that the total etching rate for both surfaces of a wafer is in the range of 0.1 to 1.0 μm/sec.

Yet another aspect of the invention represented by claim 3 is another modification of the method of claim 1 in which the etching step 16 includes acidic etching 16a followed by alkaline etching 16b, the alkaline etching solution has a concentration of 8 mol/l or higher, and the total etching rate for both surfaces of a wafer during acidic etching is adjusted to be 0.2 μm/sec or higher.

EFFECT OF THE INVENTION

As described above, the inventive method relates to an improved method for processing a silicon wafer, the method comprising a slicing step in which a single crystal ingot is sliced into thin disc-like wafers, a lapping step in which the surface of each wafer is lapped to be planar, an alkaline cleaning step in which the wafer is subjected to alkaline cleaning to be removed of contaminants resulting from preceding machining, and an etching step in which the wafer is alternately transferred between two groups of etching tanks one of which contain acidic etching solutions and the other alkaline etching solutions. The feature of the inventive method lies in its including a beveling step between the slicing step and the lapping step in which a wafer is immersed in an acidic solution containing hydrofluoric acid (HF) and nitric acid ($HNO_3$) at a volume ratio of ⅛ to ½ (HF/$HNO_3$) so that degraded superficial layers occurring on the front and rear surfaces of the wafer as a result of machining can be removed and its edge surface can be beveled.

According to the inventive method described above, instead of mechanical beveling employed by the conventional method, a step is introduced in which a wafer is immersed in an acidic solution containing hydrofluoric acid (HF) and nitric acid ($HNO_3$) at a volume ratio of ⅛ to ½ (HF/$HNO_3$) which enables simultaneously the removal of degraded superficial layers resulting from preceding machining as well as beveling of the edge of the wafer. Thus, the method simplifies processing of the wafer. The method further dispenses with the necessity of alkaline cleaning which must be introduced subsequent to mechanical machining, which will reduce the risk of the wafer being contaminated with metal impurities, particularly Cu-based impurities associated with alkaline cleaning.

BEST MODE FOR CARRYING OUT THE INVENTION

The embodiments of the invention will be described below with reference to attached drawings.

First, a grown single silicon crystal rod is cut at its frond and rear ends, and then divided into a number of blocks. The block has its periphery abraded until it becomes a cylinder having a uniform diameter. Then, an orientation flat or a notch is formed to mark the specified orientation of the crystal to produce a single crystal ingot product. The orientation flat and the notch are utilized as a reference for placing the wafer properly with respect to masks in a subsequent step during its elaboration into a device. After the step, the single crystal ingot is sliced at a specified angle to the longitudinal axis of the ingot with the blade of a cutter into thin, disc-like slices, thereby producing a plurality of silicon wafers as shown in FIG. 1(*a*) (step 11). FIG. 1(*b*) shows the cross-sections of silicon wafers having undergone the corresponding steps of FIG. 1(*a*).

According to the conventional method, since the peripheral edge of a sliced wafer is rectangular, the peripheral edge is beveled because to prevent to develop notches and flaws there. However, according to the inventive method, a wafer is immersed in an acidic solution containing hydrofluoric acid (HF) and nitric acid ($HNO_3$) at a volume ratio of ⅛ to ½ (HF/$HNO_3$) so that degraded superficial layers occurring on the front and rear surfaces of the wafer as a result of machining can be removed and its edge surface can be beveled (step 12). Immersion of a wafer in an acidic solution containing hydrofluoric acid (HF) and nitric acid ($HNO_3$) at a volume ratio of ⅛ to ½ (HF/$HNO_3$) will enable the removal of a part of degraded superficial layers occurring on the front and rear surfaces of the wafer as a result of machining and beveling of its edge surface to be accomplished simultaneously. By adjusting as appropriate the blending ratio of hydrofluoric acid and nitric acid in the acidic solution, it is possible to produce a solution which can bevel the edge of a wafer by corrosion. Such a solution can effect beveling as observed after mechanical beveling. Thus, the step 12 can substitute for the mechanical beveling step conventionally employed in the processing of a wafer, thereby reducing the chance of the intervention of alkaline cleaning which must be introduced subsequent to mechanical beveling. If the volume ratio (HF/$HNO_3$) of hydrofluoric acid (HF) to nitric acid ($HNO_3$) is less than ½, that is, if the fraction of nitric acid is greater than the specified amount, the etching rate will be higher than desired, and thickness distribution on the surfaces will be degraded, and big warps will develop. Furthermore, it will be difficult to control the shape of the surface. On the contrary, if the volume ratio of HF/$HNO_3$ is less than ⅛, that is, if the fraction of nitric acid is more than the specified amount, the etching rate will be so low that too much time will be required for etching to be practicable. The volume ratio (HF/$HNO_3$) of hydrofluoric acid and nitric acid in the acidic solution is preferably ⅕.

It is also possible by using an alkaline etching solution to bevel the edge of a wafer. However, etching a wafer having just undergone mechanical beveling which is usually contaminated with metal impurities using an alkaline detergent such as a KOH or NaOH-based detergent will have the risk of dispersing the metal impurities into the substrate of the wafer as well as over its surfaces. Accordingly, use of an acidic etching solution is more preferred. In terms of throughput, use of an alkaline etching solution whereby etching occurs at a slower speed is undesirable.

The rate of etching effected by an acidic etching solution containing hydrofluoric acid and nitric acid is adjusted so that the total etching rate for both surfaces of a wafer is in the range of 0.1 to 1.0 μm/sec. A preferable etching rate is 0.2 to 0.3 μm/sec.

Then, the front and rear surfaces of a wafer are mechanically abraded (lapping) so that the flatness of the surfaces of the wafer and their parallelism can be improved (step 13). The thickness of the front and rear surface bitten away during lapping is preferably adjusted to be 15 to 20 μm.

Having undergone lapping step 13, the wafer is cleaned by being immersed in an alkaline solution (step 14). The thickness of the front and rear surface of the wafer eaten away during alkaline cleaning is preferably adjusted to be less than 1 μm. The cleaning removes contaminants resulting from machining. The alkaline solution preferably consists of potassium hydroxide.

Next, the wafer is alternately transferred between two groups of etching tanks one of which contain acidic etching solutions and the other alkaline etching solutions (step 16). During step 16, any degraded superficial layers which might occur on the front and rear surfaces of the wafer as a result of the lapping step 13 are completely eliminated. The etching step 16 includes acidic etching 16a followed by alkaline etching 16b. The alkaline etching solution has a concentration of 8 mol/l or higher. If the concentration of the alkaline etching solution is less than that lower limit, facets formed on the surfaces of the wafer will become large, pits having a size of several microns or less and a depth of ten to several tens microns will develop, and the surfaces of the wafer will be roughened. To compensate for those flaws, chemical and mechanical abrasion introduced in subsequent steps must be adjusted such that thicker superficial layers can be abraded than normal. The concentration of the alkaline etching solution is preferably adjusted to be 10 mol/l or higher. The rate of etching effected by an acidic etching solution is adjusted so that the total etching rate for both surfaces of a wafer is 0.2 µm/sec or higher. A preferable etching rate is 0.2 to 0.8 µm/sec.

It is necessary to insert a cleaning step 17 between the etching step 16a and the etching step 16b. Insertion of a cleaning step 17 makes it possible to remove acid or alkali adhered to a wafer resulting from the treatment of a preceding step, thereby preventing the cross-contamination between the acidic etching tanks and the alkaline etching tanks, and minimizing the variation in composition of the solutions stored in those tanks. Having undergone etching step 16, the wafer is cleaned of detergent adhered to its surfaces (step 18).

The wafer having undergone the cleaning step 18 will be subjected to subsequent steps such as unilateral polishing, PCR (polishing corner rounding) which mirror-polishes the beveled edge of the wafer, heating, unilateral polishing using a bilateral abrader, and cleaning, to be ready to be further processed into a device.

INDUSTRIAL APPLICABILITY

The inventive method for processing a silicon wafer simplifies the steps involved in the process, and reduces the risk of contamination due to metal impurities, which may result from cleaning subsequent to various machining processes.

REFERENCE NUMERALS

Figure 1:
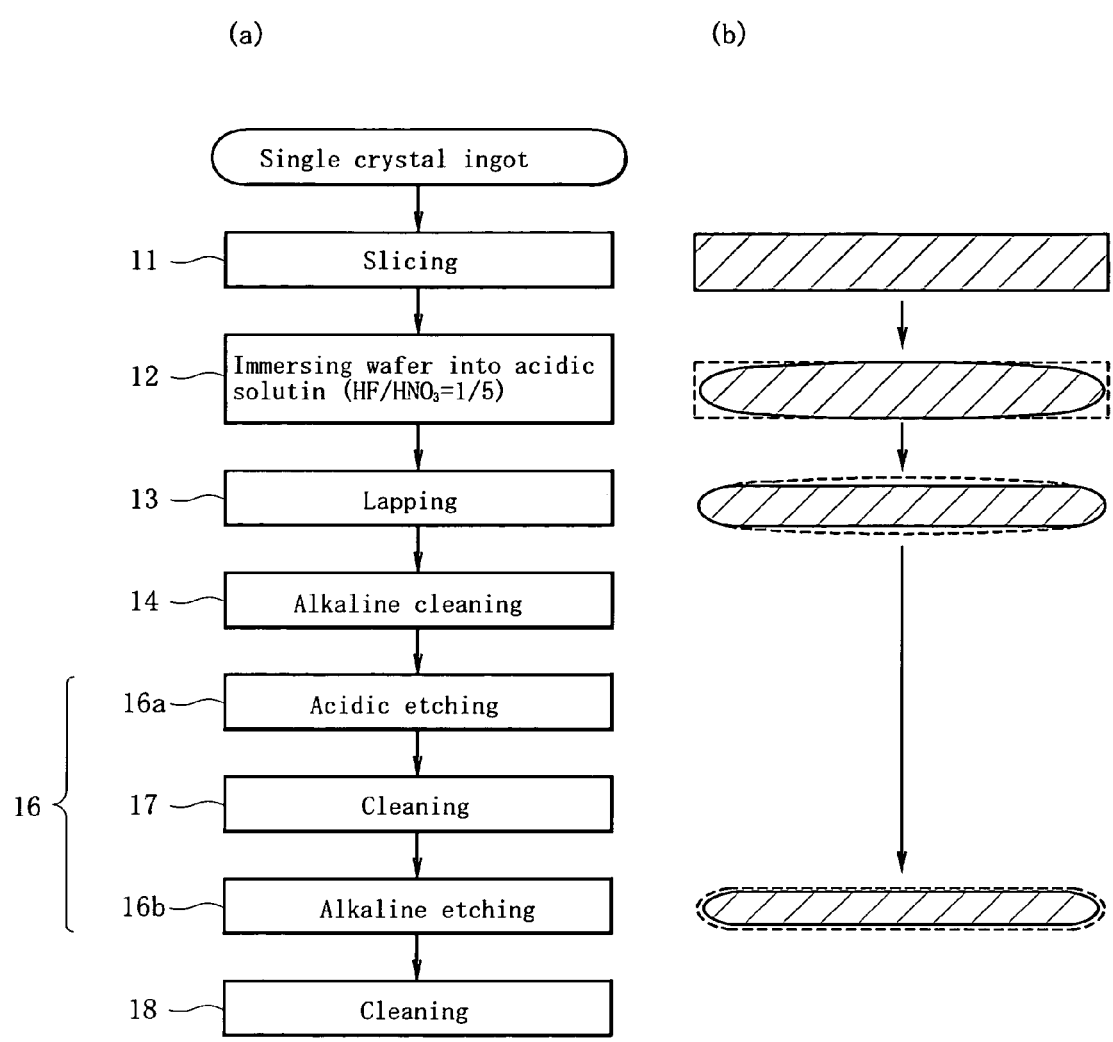
FIG. 1 is a flowchart representing the steps for processing a silicon wafer according to the inventive method.
Figure 2:
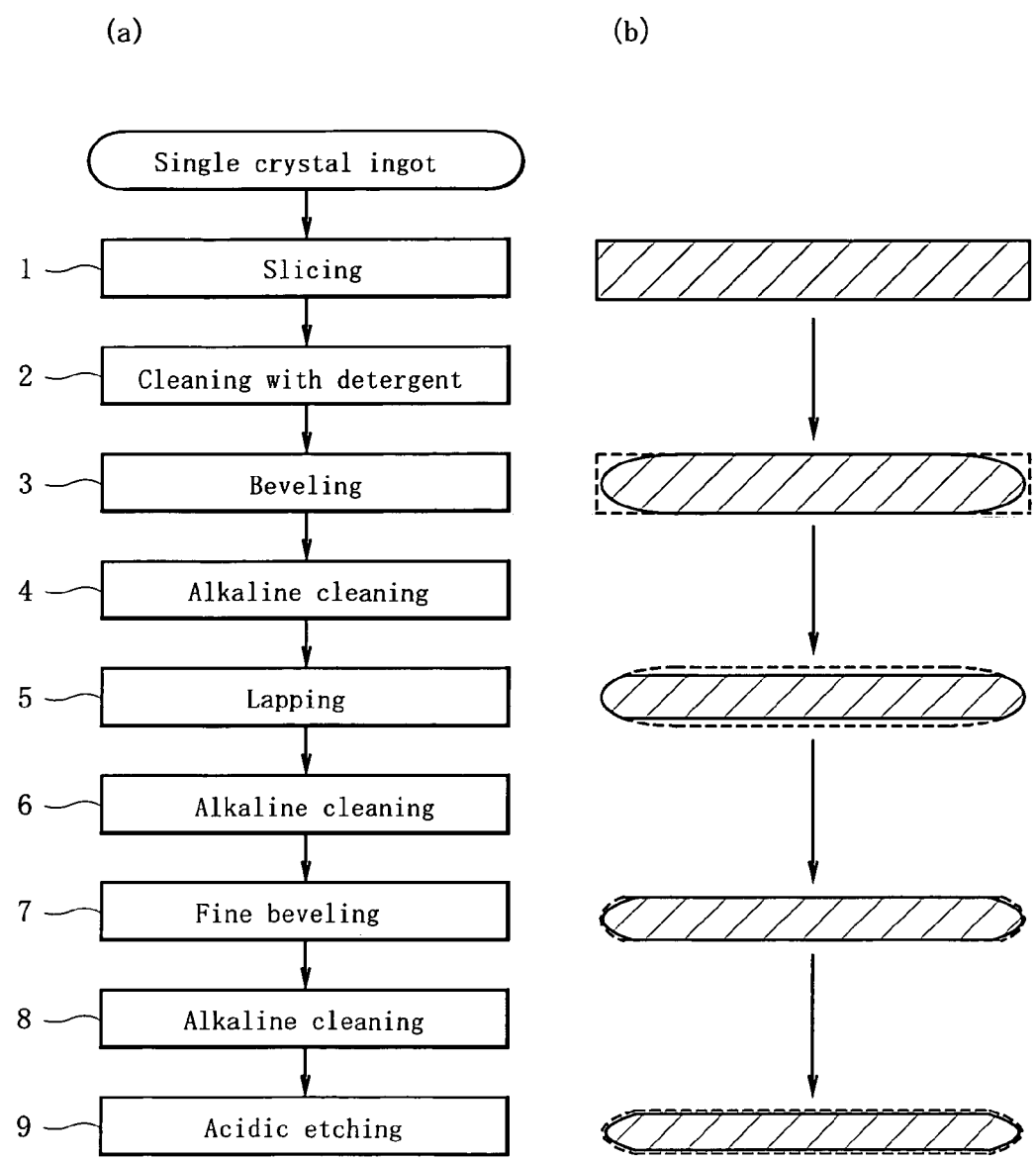
FIG. 2 is a flowchart representing the steps for processing a silicon wafer according to a conventional method.

1: Slicing step
12: Acidic solution immersion step
13: Lapping step
14: Alkaline cleaning step
16: Etching step

FIG. 1(a)

Single Crystal Ingot
11: Slicing
12: Immersing wafer into acidic solution (HF/HNO$_3$=⅕)
13: Lapping
14: Alkaline cleaning
16a: Acidic etching
17: Cleaning
16b: Alkaline etching

FIG. 2(a)

Single Crystal Ingot
1: Slicing
2: Cleaning with detergent
3: Beveling
4: Alkaline cleaning
5: Lapping
6: Alkaline cleaning
7: Fine beveling
8: Alkaline cleaning
9: Acidic etching

The invention claimed is:

1. A method for processing a silicon wafer comprising:
a slicing step (11) in which a single crystal ingot is sliced into thin disc-like wafers;
a lapping step (13) in which the surface of each wafer is lapped to be planar;
an alkaline cleaning step (14) in which the wafer is subjected to alkaline cleaning to be removed of contaminants resulting from preceding machining; and
an etching step (16) in which the wafer is alternately transferred between two groups of etching tanks one of which contain acidic etching solutions and the other alkaline etching solutions, wherein:
a beveling step (12) is introduced between the slicing step (11) and the lapping step (13), in which the wafer is immersed in an acidic solution containing hydrofluoric acid (HF) and nitric acid (HNO$_3$) at a volume ratio of ⅛ to ½ (HN/HNO$_3$) so that degraded superficial layers occurring on the front and rear surfaces of the wafer as a result of machining can be removed and the edge surface of the wafer can be beveled.

2. A method of claim 1 wherein the etching using an acidic solution containing hydrofluoric acid and nitric acid is adjusted such that the total etching rate summed for both surfaces of a wafer is in the range of 0.1 to 1.0 µm/sec.

3. A method of claim 1 wherein the etching step (16) includes acidic etching (16a) followed by alkaline etching (16b), the alkaline etching solution has a concentration of 8 mol/l or higher, and the total etching rate summed for both surfaces of a wafer during acidic etching is adjusted to be 0.2 µm/sec or higher.

* * * * *